United States Patent
Koh

(10) Patent No.: US 7,087,459 B2
(45) Date of Patent: Aug. 8, 2006

(54) METHOD FOR PACKAGING A MULTI-CHIP MODULE OF A SEMICONDUCTOR DEVICE

(75) Inventor: Kyung Hee Koh, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 49 days.

(21) Appl. No.: 10/751,198

(22) Filed: Dec. 30, 2003

(65) Prior Publication Data

US 2004/0157365 A1   Aug. 12, 2004

(30) Foreign Application Priority Data

Dec. 30, 2002   (KR) .................. 10-2002-0086244

(51) Int. Cl.
*H01L 21/44* (2006.01)
(52) U.S. Cl. .................. 438/109; 257/E23.08
(58) Field of Classification Search ............ 257/777, 257/E23.08; 438/107, 109
See application file for complete search history.

(56) References Cited

U.S. PATENT DOCUMENTS

| | | | | |
|---|---|---|---|---|
| 3,766,439 | A | * | 10/1973 | Isaacson ................ 361/714 |
| 5,776,797 | A | * | 7/1998 | Nicewarner et al. ...... 438/107 |
| 6,552,910 | B1 | * | 4/2003 | Moon et al. ............ 361/749 |
| 6,600,222 | B1 | * | 7/2003 | Levardo ................ 257/686 |
| 6,670,700 | B1 | * | 12/2003 | Hashimoto .............. 257/686 |
| 6,699,730 | B1 | * | 3/2004 | Kim et al. ............. 438/107 |
| 2002/0114143 | A1 | * | 8/2002 | Morrison et al. ........ 361/749 |
| 2002/0164838 | A1 | * | 11/2002 | Moon et al. ........... 438/107 |

* cited by examiner

*Primary Examiner*—Bradley K. Smith
(74) *Attorney, Agent, or Firm*—Andrew D. Fortney

(57) ABSTRACT

A method for packaging a multi-chip module is carried out by connecting a first chip having thereon wafer bumps to lower parts of inner leads of TAB tapes having the inner lead and an outer lead, thereby electrical signals being communicated therebetween; connecting a second chip having thereon wafer bumps to an upper part of the TAB tapes connected to the first chip, thereby electrical signals being communicated therebetween; and executing an encapsulation step, wherein an underfill material is filled in a connecting portion between the TAB tapes and the chips.

8 Claims, 6 Drawing Sheets

METHOD FOR PACKAGING A MULTI-CHIP MODULE OF A SEMICONDUCTOR DEVICE

FIELD OF THE INVENTION

The present invention relates to a method for packaging a multi-chip module of a semiconductor device; and, more particularly, to a method for packaging a multi-chip module of a semiconductor device to realize a chip scale package for a surface mount package module by using a double-sided flip chip process.

BACKGROUND OF THE INVENTION

A semiconductor packaging technology for protecting a chip formed on a silicon wafer from external environment and connecting the chip to circuit components and a substrate has been developed remarkably. Recently, an insert mount package such as a dual in-line package (DIP) is nearly unused, but other surface mount packages such as a small outline package (SOP), a quad flat package (QFP), a thin small outline package (TSOP) and a paper thin package (PTP) are prevalently used as a semiconductor packaging technology.

Meanwhile, semiconductor devices have a tendency toward miniaturization and large integration; and, as a result, a packaging technique to modularize the surface mount package is continuously investigated.

However, there exists a difficulty in realizing miniaturization and large integration of the surface mount package module. Therefore, a chip scale package is required, in which a package miniaturized to have almost the same dimensions as a chip to be mounted therein.

SUMMARY OF THE INVENTION

It is, therefore, an object of the present invention to provide a packaging method for realizing a chip scale packaging for a surface mount package module by applying a double-sided flip chip process.

In accordance with a preferred embodiment of the present invention, there is provided a method for packaging a multi-chip module, including the steps of: connecting a first chip having thereon wafer bumps to lower parts of inner leads of TAB tapes having the inner lead and an outer lead, thereby electrical signals being communicated therebetween; connecting a second chip having thereon wafer bumps to an upper part of the TAB tapes connected to the first chip, thereby electrical signals being communicated therebetween; and executing an encapsulation step, wherein an underfill material is filled in a connecting portion between the TAB tapes and the chips.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

A preferred embodiment of the present invention will now be described in detail with reference to the accompanying drawings.

Figure 1:
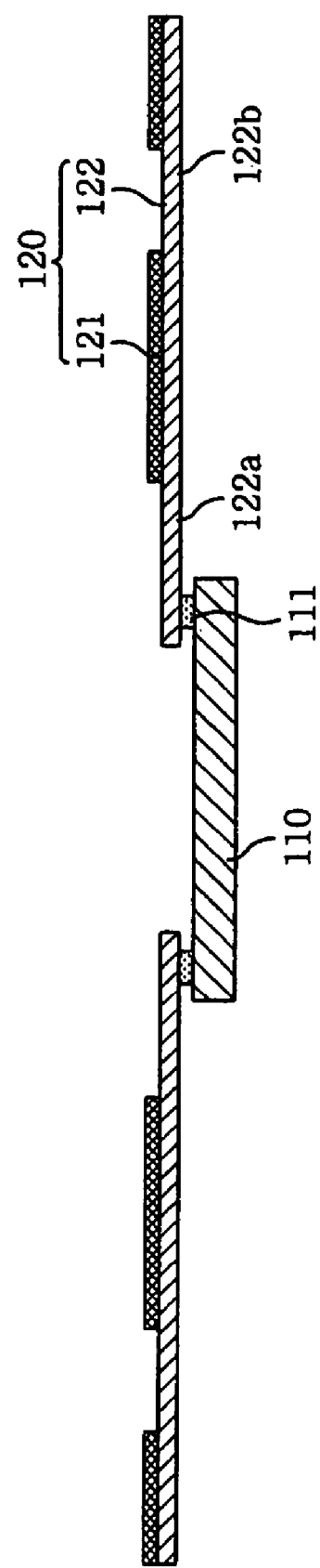
FIG. 1 shows a first chip connected to inner leads of TAB tapes.

Referring to FIG. 1, wafer bumps 111 are formed on a surface of a bond pad through a dry film resist process. One of the wafer bumps 111 functions as an intermediate to connect a chip with an external terminal.

After an adhesive is coated on a surface of a base film 121, a metal foil (i.e., copper foil) 122 is adhered thereto. Then, a TAB (tape automated bonding) tape 120 having an inner lead 122a and an outer lead 122b is produced by forming a pattern on the metal foil 122 through etching thereof.

Further, by sawing a wafer having the wafer bumps 111 by using a diamond blade rotating at high speed, the wafer are divided into individual semiconductor chips.

After performing the above described pre-processes, the following assembly process is performed for chip scale packaging.

In order to connect a first chip 110 with an external terminal, the first chip 110 having thereon the wafer bumps 111 is connected to lower part of the inner lead 122a of the TAB tape 120 so that electrical signals can be communicated by using a gang bonding or a single point bonding method. In case of using the gang bonding method, for example, the inner lead 122a of the TAB tape 120 is bonded to the surface of the wafer bump 111 of the first chip 110 at one time by using a heating tool.

Figure 2:
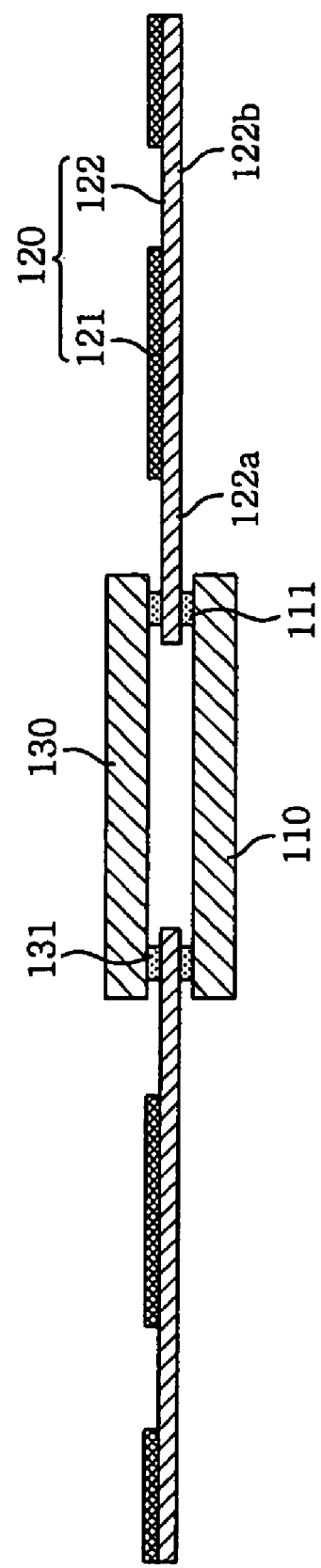
FIG. 2 depicts an assembly of FIG. 1 to which a second chip is connected.

Now referring to FIG. 2, in order to connect a second chip 130 having thereon wafer bumps 131 to an external terminal, the second chip 130 is connected to the upper part of the TAB tape 120 connected to the first chip 110 by using a flip-chip process. Specifically, the second chip 130 having the wafer bumps 131 is arranged on the TAB tape 120 which is composed of the base film 121 and the metal foil 122 where a circuit is formed by using a mounting tool. Then, in order to communicate electrical signals between the TAB tapes 120 and the second chip 130, the inner leads 122a of the TAB tapes 120 are bonded to the surface of the wafer bumps 131 of the second chip 130 at one time by using a heating tool.

Figure 3:
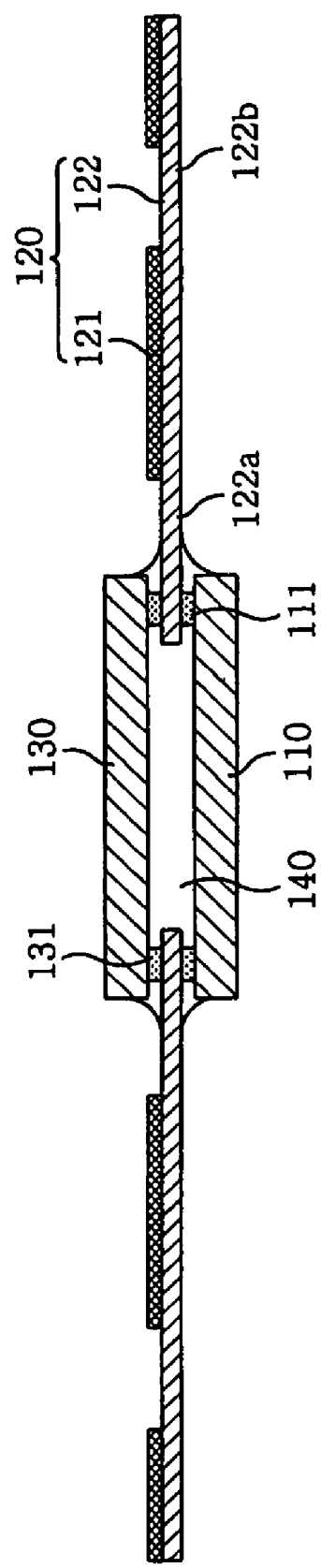
FIG. 3 represents an assembly of FIG. 2 which is filled with an underfill material.

Thereafter, as shown in FIG. 3, an encapsulation process is executed to protect the chips 110 and 130 connected to the TAB tape 120, wherein an underfill material (e.g., epoxy resin, silicon resin or the like) is filled in a connecting portion of TAB tape 120 and chips 110 and 130 regularly and then cured. Therefore, durability and reliability of the chips can be improved. Further, oxidization and corrosion may be prevented through the filling material.

Figure 4:
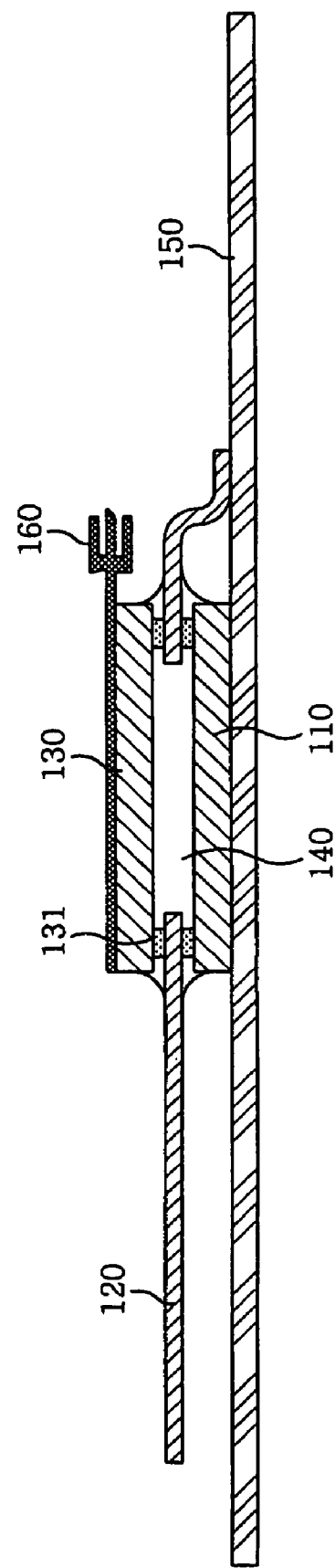
FIG. 4 illustrates an assembly of FIG. 3 to which a radiator is connected.

Subsequently, as shown in FIG. 4, the outer lead 122b of the TAB tape 120 is mounted and bonded on a PCB (Printed Circuit Board) substrate 150 or other patterned circuits. A radiator 160, which dissipates heat generated inside the chips 110 and 130 is then mounted on the chip 130 using a conductive adhesive coated thereon in order to prevent temperature increase of the chips 110 and 130. In this way, a basic multi-chip module is completed.

Figure 5:
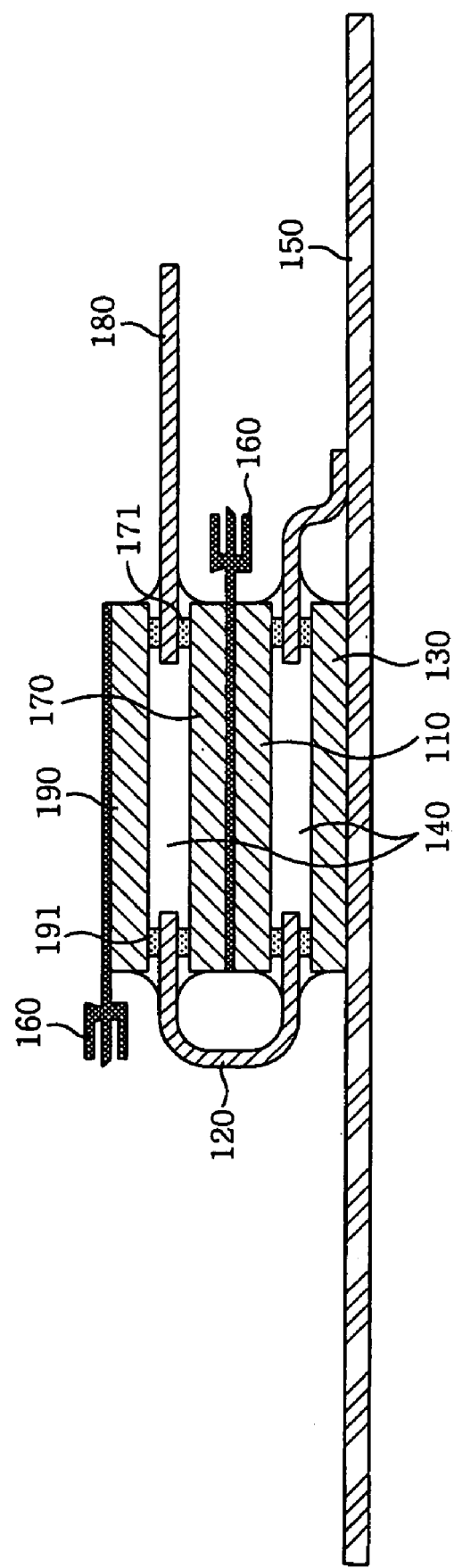
FIG. 5 offers an assembly of FIG. 4 to which a third and a fourth chips and a radiator is connected.
Figure 6:
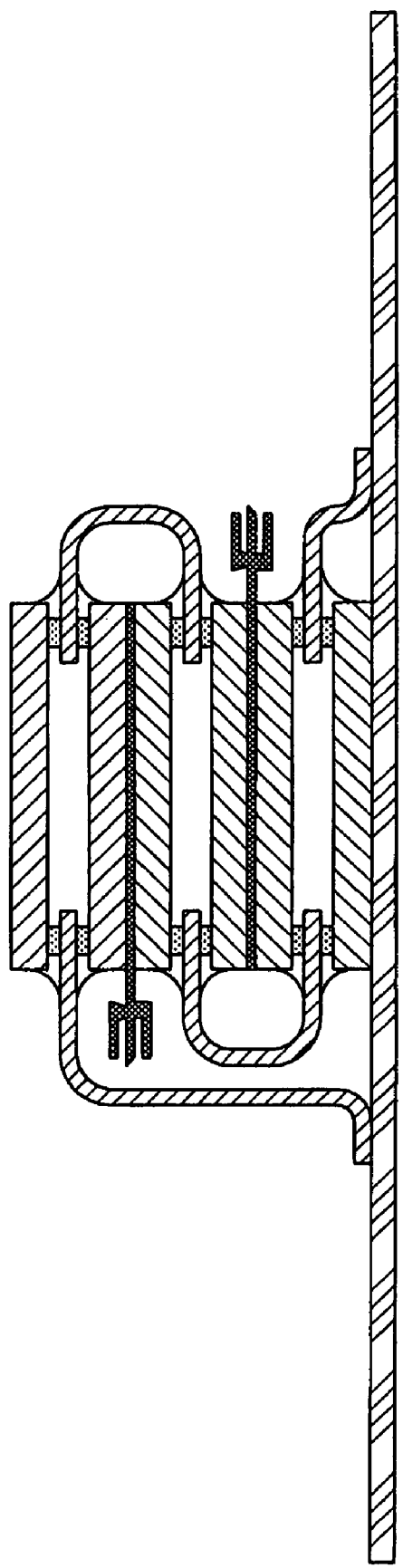
FIG. 6 illustrates a package connecting a fifth and a sixth chips to a multi-chip module of FIG. 5.

Meanwhile, a plurality of chips can be additionally packaged in the above produced basic multi-chip module as shown in FIGS. 5 and 6.

Referring to FIG. 5, after coating a conductive adhesive on the radiator 160, a third chip 170 having wafer bumps 171 may be mounted thereon.

In order to connect the third chip 170 to the first chip 110 and the second chip 130, an outer lead 122b of a TAB tape 120 connected to the first chip 110 and the second chip 120 is bonded to one of the wafer bumps 171 of the third chip 170 at one time by using a heating tool.

Further, in order to connect the third chip 170 to the external terminal, an inner lead of a TAB tape 180 is connected to the other wafer bump 171 at one time by heating tool.

Then, the same procedure as described with reference to FIG. 2 to 4 may be executed. That is, a fourth chip 190 having wafer bumps 191 is connected to the upper side of the TAB tape 120 and 180 connected to the third chip 170 by using the flip chip process. Subsequently, the multi-chip module is subject to the encapsulation process which injects an underfill material. Then, after coating a conductive adhesive on the fourth chip 190, a radiator 160 is bonded thereon.

FIG. 6 shows a package connecting a fifth and a sixth chips into the multi-chip module shown in FIG. 5. A detailed description thereof will be omitted since it is easily understood from the above-described procedure.

In FIGS. 4 and 5, though the TAB tapes 120 and 180 are not connected to the PCB substrate 150 in consideration for next processes, the outer leads of the TAB tapes 120 and 180 are bonded to the PCB substrate in case the procedure is completed in the process.

As described above, in accordance with the present invention, a chip scale package for a surface mount package module can be realized by applying a double-sided flip chip process and radiating heat generated inside a chip.

Further, since every bond pads of the chip can be bonded at one time, a whole packaging procedure is simplified. Furthermore, since an electrical test and a B/I test can be performed in the form of a tape, yield is improved.

While the invention has been shown and described with respect to the preferred embodiments, it will be understood by those skilled in the art that various changes and modifications may be made without departing from the spirit and scope of the invention as defined in the following claims.

What is claimed is:

1. A method for packaging a multi-chip module, comprising the steps of:

connecting wafer bumps in a peripheral region of a first chip to lower parts of inner leads of first and second TAB tapes, each of the first and second TAB tapes having an inner lead and an outer lead;

connecting wafer bumps in a peripheral region of a second chip to upper parts of the inner leads of the first and second TAB tapes connected to the first chip, thereby electrical signals being communicated therebetween;

mounting the outer lead of the first TAB tape on a patterned circuit;

connecting a third chip having thereon wafer bumps to an upper part of the second chip;

connecting an outer lead of the second TAB tape to at least one of the wafer bumps in a peripheral region of the third chip;

connecting an inner lead of a third TAB tape having the inner lead and an outer lead to at least one other wafer bump in the peripheral region of the third chip;

connecting wafer bumps in a peripheral region of a fourth chip to the outer lead of the second TAB tape and the inner lead of the third TAB tape; and executing at least one encapsulation step, wherein an underfill material is filled in connecting portions between the first, second and third TAB tapes and the first, second, third and fourth chips.

2. The method of claim 1, further comprising the steps of coating a first conductive adhesive on the upper part of the second chip and mounting a radiator on the first conductive adhesive.

3. The method of claim 2, further comprising the steps of coating a second conductive adhesive on the upper part of the fourth chip and mounting a radiator on the second conductive adhesive.

4. The method of claim 3, wherein the chips and the TAB tapes are connected to each other by using gang bonding or single point bonding method.

5. The method of claim 4, wherein the chips and the TAB tapes are connected to each other by bonding the inner leads of the TAB tapes to the wafer bumps of the chips.

6. The method of claim 1, wherein the chips and the TAB tapes are connected to each other by using gang bonding or single point bonding method.

7. The method of claim 6, wherein the chips and the TAB tapes are connected to each other by bonding the inner leads of the TAB tapes to the wafer bumps of the chips.

8. The method of claim 1, further comprising the step of connecting the outer lead of the third TAB tape on the patterned circuit.

* * * * *